US005801715A

United States Patent [19]

Norman

[11] Patent Number: 5,801,715
[45] Date of Patent: Sep. 1, 1998

[54] MASSIVELY-PARALLEL PROCESSOR ARRAY WITH OUTPUTS FROM INDIVIDUAL PROCESSORS DIRECTLY TO AN EXTERNAL DEVICE WITHOUT INVOLVING OTHER PROCESSORS OR A COMMON PHYSICAL CARRIER

[76] Inventor: Richard S. Norman, 1877 Poissant Road, Sutton, Quebec, Canada, J0E 2K0

[21] Appl. No.: 323,580

[22] Filed: Oct. 17, 1994

Related U.S. Application Data

[63] Continuation of Ser. No. 803,166, Dec. 6, 1991, abandoned.

[51] Int. Cl.$^6$ .................................................. G06F 15/16
[52] U.S. Cl. .................... 345/505; 345/526; 395/800.11
[58] Field of Search ........................... 395/800, 375, 395/800.11; 345/505, 502, 526, 55, 90

[56] References Cited

U.S. PATENT DOCUMENTS

| | | | |
|---|---|---|---|
| 4,591,980 | 5/1986 | Huberman et al. | 395/800.16 |
| 4,591,981 | 5/1986 | Kassabov | 395/800.22 |
| 4,622,632 | 11/1986 | Tanimoto et al. | 395/800.11 |
| 4,709,327 | 11/1987 | Hillis et al. | 395/800.14 |
| 4,720,780 | 1/1988 | Dolecek | 395/800.18 |
| 4,855,903 | 8/1989 | Carleton et al. | 395/200.78 |
| 4,873,626 | 10/1989 | Gifford | 395/300 |
| 4,905,145 | 2/1990 | Sauber | 395/800.28 |
| 4,908,751 | 3/1990 | Smith | 395/800.12 |
| 4,933,836 | 6/1990 | Tulpule et al. | 395/800.12 |
| 4,942,517 | 7/1990 | Cok | 395/800.11 |
| 4,979,096 | 12/1990 | Ueda et al. | 395/200.78 |
| 4,985,832 | 1/1991 | Grondalski | 395/800.22 |
| 5,056,000 | 10/1991 | Chang | 395/290 |
| 5,058,001 | 10/1991 | Li | 395/500 |
| 5,148,547 | 9/1992 | Kahle et al. | 395/800.22 |
| 5,157,785 | 10/1992 | Jackson et al. | 395/800.12 |
| 5,175,865 | 12/1992 | Hillis | 395/800.13 |
| 5,243,699 | 9/1993 | Nickolls et al. | 395/800.11 |
| 5,253,308 | 10/1993 | Johnson | 382/308 |
| 5,263,096 | 11/1993 | Yu et al. | 382/308 |
| 5,268,973 | 12/1993 | Jenevein | . |
| 5,307,506 | 4/1994 | Colwell et al. | 395/307 |
| 5,377,333 | 12/1994 | Nakagoshi et al. | 395/312 |
| 5,410,727 | 4/1995 | Jaffe et al. | 395/800 |
| 5,523,769 | 6/1996 | Lauer et al. | 345/1 |
| 5,682,520 | 10/1997 | Fang et al. | 345/502 |

OTHER PUBLICATIONS

The Silicon Retina, A chip based on the neural architecture of the eye proves a new, more powerful way of doing computations, Mead et al, Scientific American, May 1991, pp. 76–82.

Machines From the Lunatic Fringe, A trillion calculations a second? In a quantum leap for supercomputers, a radical new design opens exciting vistas for science and industry, by P. Elmer–Dewitt, Time, Nov. 11, 1991, pp. 74–75.

Primary Examiner—William M. Treat
Assistant Examiner—Kenneth R. Coulter
Attorney, Agent, or Firm—Fishman, Dionne, Cantor & Colburn

[57] ABSTRACT

A massively parallel data processing system consisting of an array of closely spaced cells where each cell has direct output means as well as means for processing, memory and input. The data processing system according to the present invention overcomes the von Neumann bottleneck of uniprocessor architectures, the I/O and memory bottlenecks that plague parallel processors, and the input bandwidth bottleneck of high-resolution displays.

19 Claims, 10 Drawing Sheets

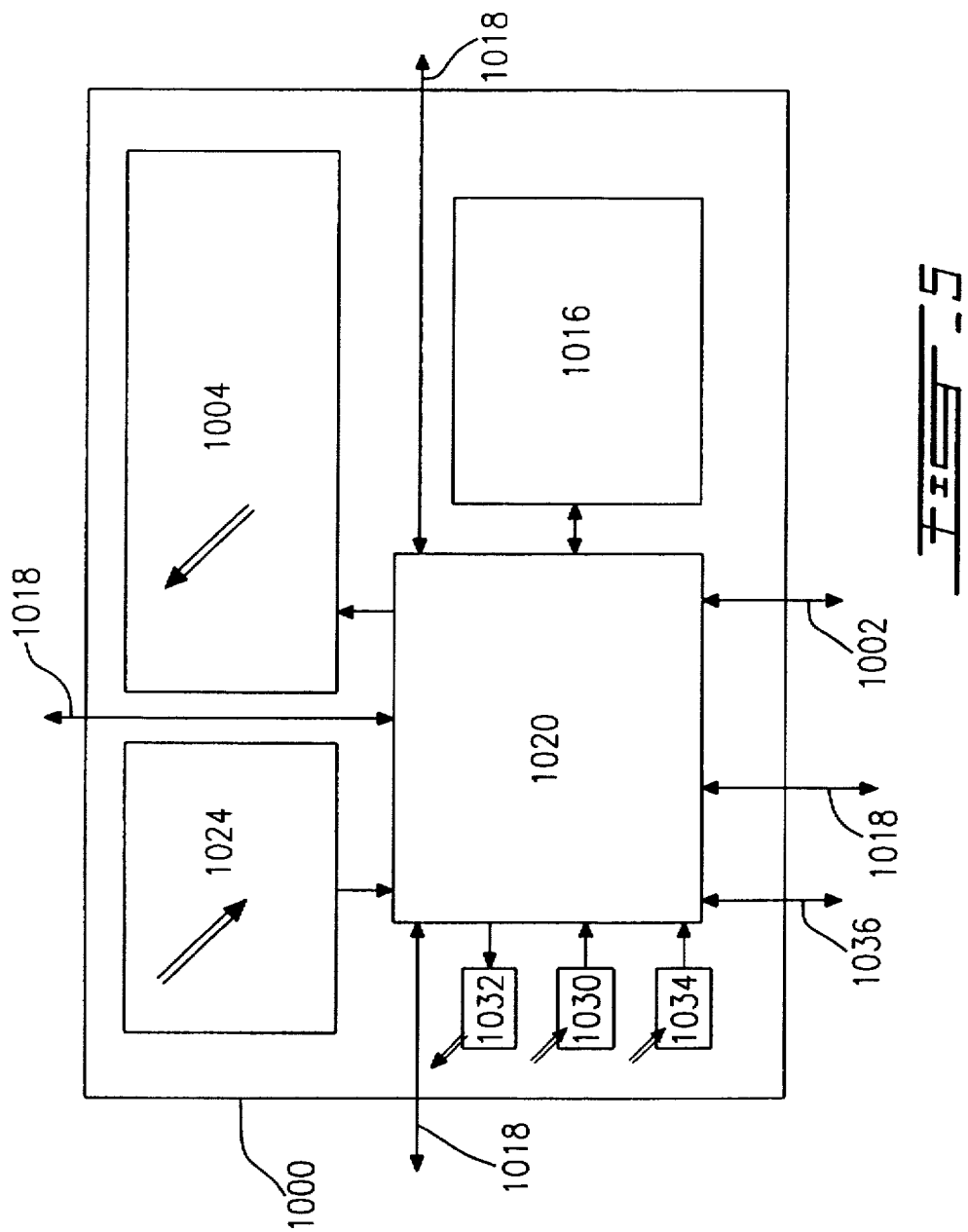

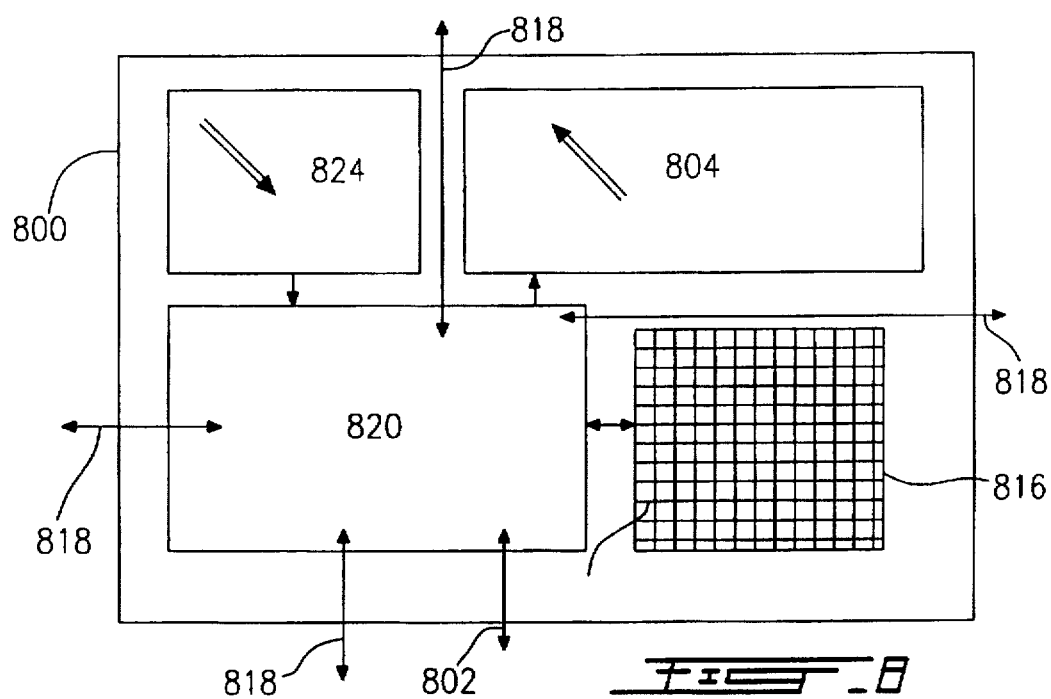
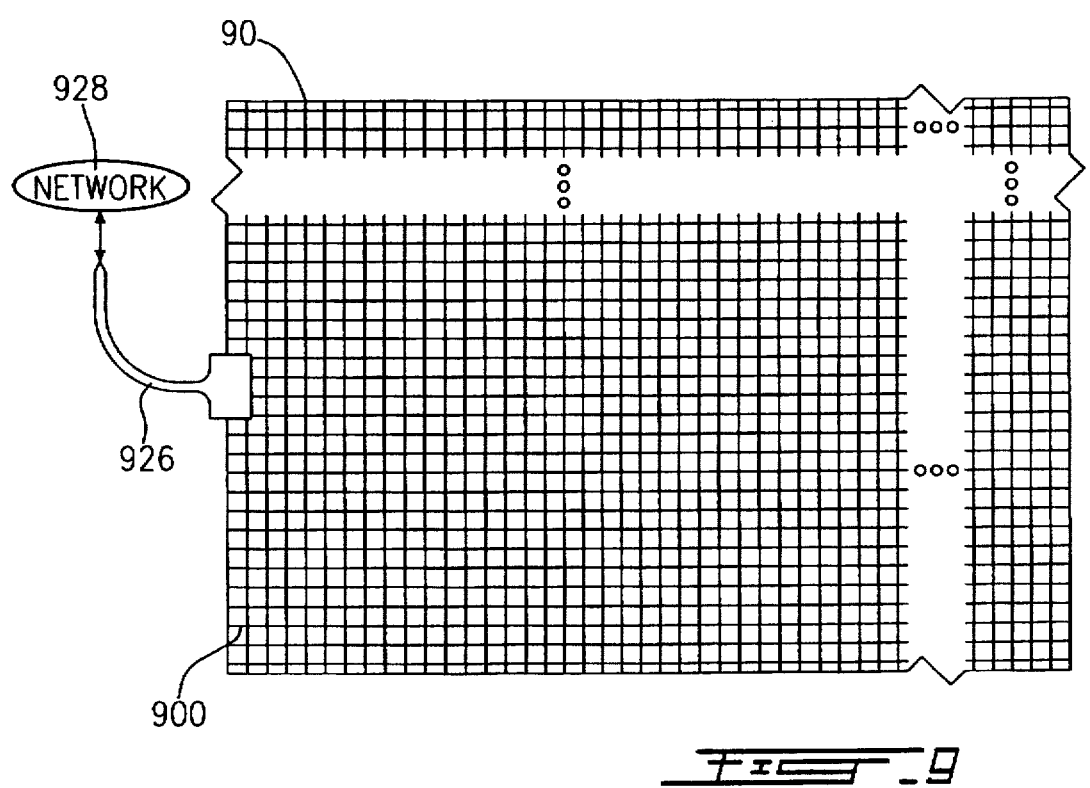

MASSIVELY-PARALLEL PROCESSOR ARRAY WITH OUTPUTS FROM INDIVIDUAL PROCESSORS DIRECTLY TO AN EXTERNAL DEVICE WITHOUT INVOLVING OTHER PROCESSORS OR A COMMON PHYSICAL CARRIER

This is a continuation of application Ser. No. 07/803,166 filed on Dec. 6, 1991 now abandoned.

BACKGROUND OF THE INVENTION

1. Field of the Invention

The present invention relates to improvements in data processing systems. More particularly, the invention is directed to a massively parallel data processing system containing an array of closely spaced cells where each cell has direct output means as well as means for input, processing and memory.

2. Description of the Prior Art

Parallel computer systems are well known in the art. IBM's 3084 and 3090 mainframe computers, for example, use parallel processors sharing a common memory. While such shared memory parallel systems do remove the von Neumann single processor bottleneck, the funnelling of memory access from all the processors through a single data path rapidly reduces the effectiveness of adding more processors. Parallel systems that overcome this bottleneck through the addition of local memory are also known in the art. U.S. Pat. No. 5,056,000, for example, discloses a system using both local and shared memory, and U.S. Pat. No. 4,591,981 discloses a local memory system where each "local memory processor" is made up of a number of smaller processors sharing that "local" memory. While in these systems each local memory processor has its own local input and output, that input and output is done through external devices. This necessitates having complex connections between the processors and external devices, which rapidly increases the cost and complexity of the system as the number of processors is increased.

Massively parallel computer systems are also known in the art. U.S. Pat. Nos. 4,622,632, 4,720,780, 4,873,626, 4,905,145, 4,985,832, 4,979,096, 4,942,517 and 5,058,001, for instance, disclose examples of systems comprising arrays of processors where each processor has its own memory. While these systems do remove the von Neumann single processor bottleneck and the multi-processor memory bottleneck for massively parallel applications, the output of the processors is still gathered together and funnelled through a single data path to reach a given external output device. This creates an output bottleneck that limits the usefulness of such systems for output-intensive tasks, and the reliance on connections to external input and output devices increases the size, cost and complexity of the overall systems.

Even massively parallel computer systems where separate sets of processors have separate paths to I/O devices, such as those disclosed in U.S. Pat. Nos. 4,591,980, 4,933,836 and 4,942,517 and Thinking Machines Corp.'s Connection Machine CM-5, rely on connections to external devices for their input and output. Having each processor set connected to an external I/O device also necessitates having a multitude of connections between the processor array and the external devices, thus greatly increasing the overall size, cost and complexity of the system. Furthermore, output from multiple processor sets to a single output device, such as an optical display, is still gathered together and funnelled through a single data path to reach that device. This creates an output bottleneck that limits the usefulness of such systems for display-intensive tasks.

Input arrays are also known in the art. State-of-the-art video cameras, for example, use arrays of charge-coupled devices (CCD's) to gather parallel optical inputs into a single data stream. Combining a direct input array with a digital array processor is disclosed in U.S. Pat. No. 4,908, 751, and is mentioned as an alternative input means in U.S. Pat. No. 4,709,327. Direct input arrays that do analog processing of the incoming data have been pioneered by Carver Mead, et al., (Scientific American, May 1991). While such direct-input/processor arrays do eliminate the input bottleneck to the processor array, these array elements lack direct output means and hence do not overcome the output bottleneck. Reliance on connections to external output devices also increases the size, cost and complexity of the overall systems.

Output arrays where each output element has its own transistor are also known in the art and have been commercialized for flat-panel displays, and some color displays use display elements with one transistor for each color. Since the limited "processing power" associated with each output element cannot add or subtract or edit-and-pass-on a data stream, such display elements can do no data decompression or other processing, and thus the output array still requires a single uncompressed data stream, creating a band-width bottleneck as array size increases.

Portable computer systems are also known in the art. Smaller and smaller systems are being introduced every year, but the most compact systems suffer from extremely limited processing power, cramped keyboards, and limited battery life. Traditional system assembly techniques assemble systems from many separate pieces, which leads to inefficient use of space. Current processor architectures use much of the area of each processor chip with wiring for long distance communication. Furthermore, lithography errors limit the size of processor and memory chips so many separate chips must be used in a system. Processor chips and memory chips are produced on separate thin semi-conductor wafers, and these wafers are diced into their component chips of which a number then are encapsulated in bulky packages and affixed to even bulkier printed circuit boards. These boards are then connected to separate external devices for input and output, creating systems many orders of magnitude bigger than the component chips themselves.

Integrated circuits fabricated from amorphous silicon, as opposed to crystalline silicon, are also known in the state of the art. Amorphous silicon, though, is far less consistent a substrate, making it far more difficult to fabricate super-miniature components, and larger components are slower as well as bulkier than smaller ones. Since processor speed is the main bottleneck in the uni-processor computers that dominate the computer world, and since information gathering speed is a growing bottleneck in the massively parallel systems that are trying to replace them, the slower amorphous silicon integrated circuits have not been competitive with crystalline silicon in spite of their lower per-circuit fabrication costs.

SUMMARY OF THE INVENTION

It is therefore one object of the present invention to provide an ultra-high-resolution display containing an array of closely spaced cells where each cell has optical direct output means, input means, and memory and processing means just sufficient to extract a datum from a compressed data stream and to transmit that datum through the direct output means, thus maximizing the number of cells that can be fabricated in a given area.

It is another object of the present invention to overcome the drawbacks in current parallel processing systems by providing a massively parallel data processing system containing an array of closely spaced cells where each cell has direct output means, input means, and means for sufficient memory and processing to perform general data processing, allowing the array to handle a wide range of parallel processing tasks without processor, memory or output bottlenecks.

It is another object of the present invention to provide a massively parallel data processing system that minimizes the distances between input, output, memory and processing means, allowing lower voltages to be used and less power to be consumed during operation.

It is another object of the present invention to provide an array of closely spaced cells where each cell has direct input means, direct output means and means for memory and processing, allowing the array to communicate with external devices without physical connections to those devices.

It is another object of the present invention to provide a data processing system containing an array of closely spaced cells interconnected with spare cells in a network that is highly tolerant of defective cells, allowing large arrays to be fabricated as single units with high production yields in spite of defective cells.

It is another object of the present invention to provide a data processing architecture that maximizes system speed relative to component speed, thereby making practical the fabrication of components from lower-cost, but slower, amorphous silicon.

It is another object of the present invention to provide a data processing architecture that simplifies the implementation of continuous manufacturing processes through the at-least-linear replication of all complex components.

It is a further object of the present invention to provide a method for implementing any of the aforementioned objects of the present invention in single thin sheet.

In accordance with one aspect of the invention, there is thus provided an apparatus containing an array of closely spaced cells, each cell having access to a global input and having direct optical output means as well as minimal memory and processing means, allowing the array to receive, decompress and display data transmitted by another apparatus, such as a computer, a TV station or a VCR.

In accordance with another aspect of the invention, there is thus provided an apparatus containing an array of closely spaced cells, each cell having means for communication with neighboring cells as well as direct optical output means and minimal memory and processing means, allowing the array to receive, decompress and display a large number of parallel input streams transmitted by another apparatus such as a computer or a VCR, and allowing all array cells to be logically identical and to be produced with identical lithographic patterns.

The present invention also provides, in another aspect, a system containing an array of closely spaced cells, each cell having its own direct input means and direct output means as well as means for memory, means for processing and means for communication with neighboring cells, each cell being, in short, a complete miniature data processing system in its own right, as well as being part of a larger network, providing a massively parallel data processing system that overcomes the I/O and memory bottlenecks that plague parallel processors as well as the von Neumann bottleneck of single processor architectures, and eliminating physical interconnections between the processor/memory array and external input and output devices.

In accordance with still another aspect of the invention, there is thus provided a system containing an array of closely spaced cells, each cell having direct input means and direct output means as well as means for memory, means for processing and means for communication with neighboring cells, where all cells are identical in logical characteristics and can be produced with identical lithographic patterns, simplifying the fabrication of the array with continuous linear production techniques.

In accordance with still another aspect of the invention, there is thus provided a system comprising an array of closely spaced cells, each cell having multiple direct output means and sufficient memory and processing capabilities to simulate several smaller cells each with direct output means, increasing the output resolution of the array relative to the cell density.

In accordance with still another aspect of the invention, there is thus provided a system comprising an array of closely spaced cells, each cell having direct output means, means for memory and means for processing, interconnected with spare cells in a manner such that one or more spare cells can replace the functions of any defective cell.

The present invention also provides, in another aspect thereof, a method for producing any of the above arrays of closely space cells where the entire array is fabricated as a single thin sheet.

By the expression "massively parallel" as used herein is meant a problem, a task, or a system with at least 1000 parallel elements.

By the expression "array" as used herein is meant elements arranged in a two dimensional pattern or as the surface of a three dimensional shape.

By the expression "closely spaced cells" as used herein is meant that the average center-to-center distance between neighboring cells is less than one centimeter.

By the expression "direct output means" as used herein is meant means for a given cell to send an output signal to a device outside the array (such as a human eye) without that output signal being relayed through a neighboring cell, through a physical carrier common to the cells, or through a separate external output device.

By the expression "direct input means" as used herein is meant means for a given cell to receive an input signal from a device outside the array without that input signal being relayed through a neighboring cell, through a physical carrier common to the cells, or through a separate external input device.

By the expression "global input" as used herein is meant means for an individual cell to pick up an input signal from a physical carrier common to the cells, such as a global data bus.

By the expression "external output device" as used herein is meant an output device fabricated as a separate physical entity from the cell array.

By the expression "external input device" as used herein is meant an input device fabricated as a separate physical entity from the cell array.

By the expression "means for communication with neighboring cells" as used herein is meant input means to receive a signal from at least one neighboring cell and output means to send a signal to at least one other neighboring cell without the signals being relayed through a global data bus or through an external device.

By the expression "thin sheet" is meant a sheet whose total thickness is less than 1 centimeter.

The expression "could be produced with identical lithographic patterns" is used to solely to describe the similarity of the structures and is not to be construed as limiting the invention to embodiments produced with lithography.

BRIEF DESCRIPTION OF THE DRAWINGS

These and other objects, features and advantages of the invention will be more readily apparent from the following detailed description of the preferred embodiments of the invention in which:

FIG. 5 is a functional depiction of one processing cell with several kinds of direct input and direct output;

FIG. 8 is a functional depiction of one direct input and direct output processing cell with communication with neighboring cells;

FIG. 9 is a geometric depiction of an array of processing cells using their direct inputs and outputs to communicate with an external device.

DETAILED DESCRIPTION OF THE PREFERRED EMBODIMENTS

Figure 1A:
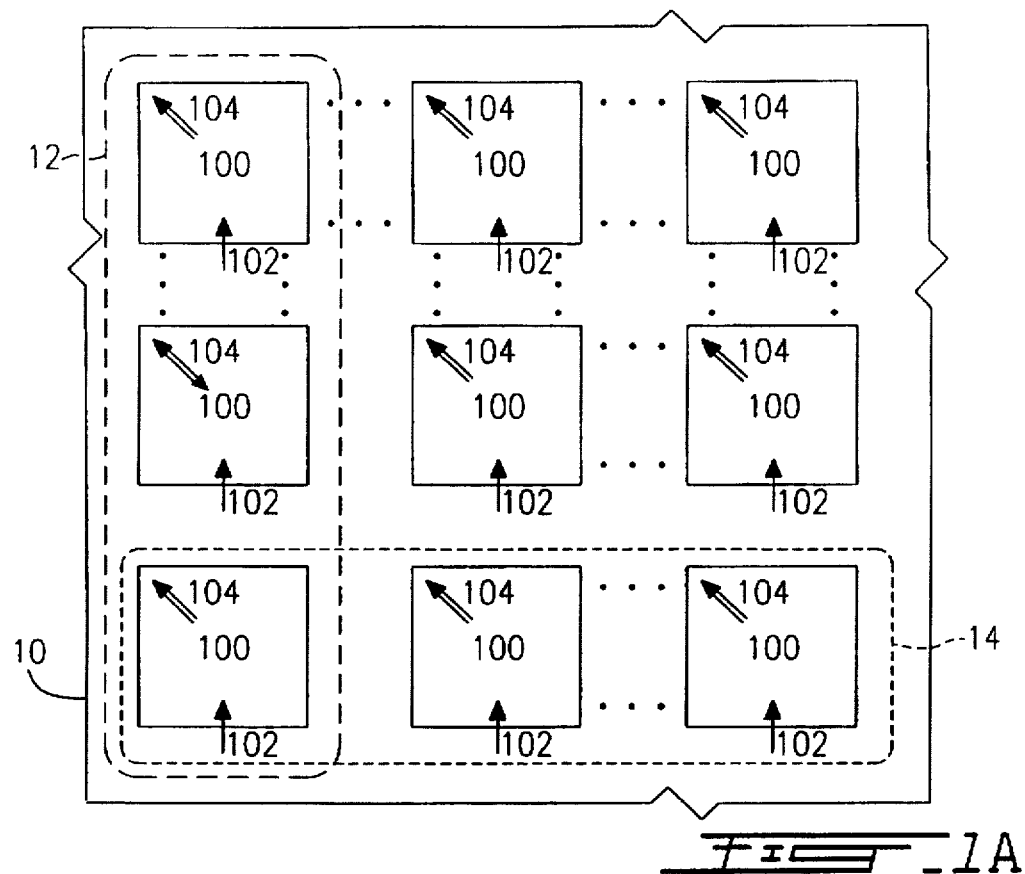
FIG. 1A is a functional depiction of an array of direct output data-decompression cells in accordance with the invention.

Conventions used in the drawings:

A single lined arrow is used to represent input to or output from a cell from or to another element of the array, A double lined arrow is used to represent direct input to or output from a cell, A triple lined arrow is used to represent input to or output from a cell through a physical connection to an external device, A dotted lined arrow is used to represent input to or output from a cell spare cell to the direct input and output means of a cell whose functions it replaces, and A double headed arrow is used to represent a bi-directional input/output path.

Ultra-High Resolution Displays

Traditional output arrays use output elements that contain no processing power of their own, but merely transmit preprocessed data. As the array size (resolution) and scan rate increase, this puts more and more of a burden on the central processing unit and its output data path. Many high-resolution systems use specialized graphics processors to relieve the main CPU of as much as possible of this task. While this does indeed free up the CPU by shifting the problem to a faster and less expensive processor, the increased speed further intensifies the pressure on the output data path bottleneck. Adding a specialized graphics processor also increases the size, complexity and cost of the overall system.

Figure 1B:
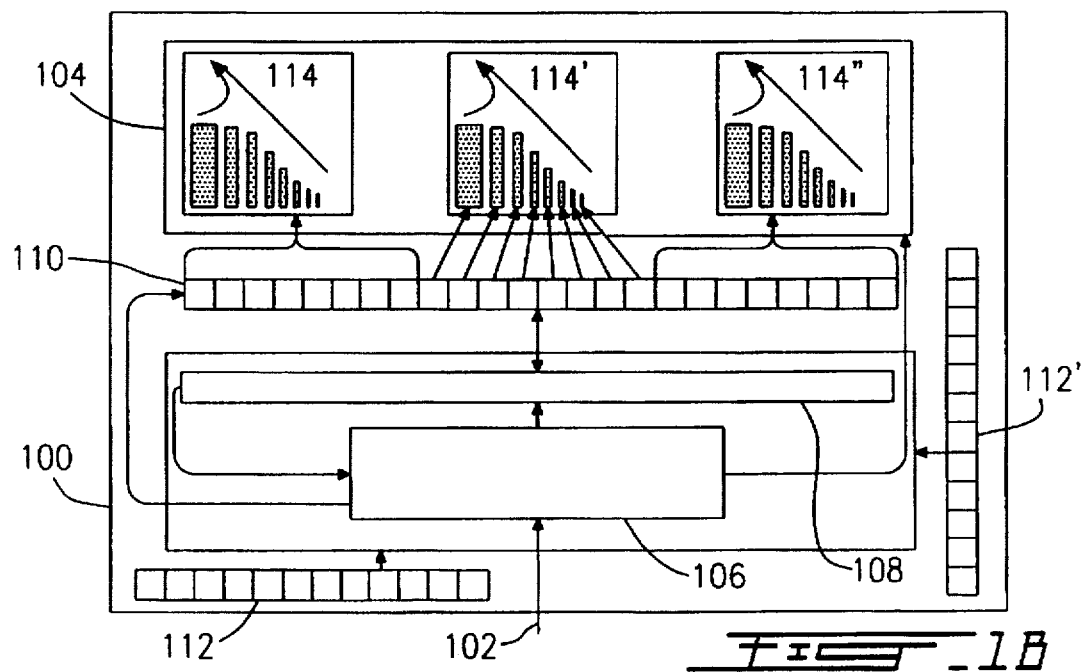
FIG. 1B is a functional depiction of one of the cells of FIG. 1A.

Accordingly, the compressed-output-data architecture according to one embodiment of the present invention as shown in FIGS. 1A and 1B overcomes this bottleneck with an ultra-high resolution display containing an array 10 of output cells 100 where each output cell contains sufficient processing power to extract its output data from the compressed data stream. Each array cell 100 in this embodiment contains a global input 102, optical direct output means 104, a count register 110, the negative of its cell address (in two's complement form) 112 and 112', and the processing power to add a number from the input 102 to the count register 110 and check the result for a register overflow. Types of optical direct output means 104 include, but are not limited to, light emitting diodes (LEDs), liquid crystal display elements (LCDs), semi-conductor lasers and ultra-miniature cathode ray tubes (CRTs). Because each cell in this embodiment has means for direct optical output, the array of cells creates a light pattern on its surface, and thus functions as an optical display. An example of a data compression scheme and sufficient processing power to decompress it is to provide each cell with a four-instruction decoder 106. Two-bit opcodes are used to represent the four different instructions—"This cell's output becomes . . . (COB)", "Next N cells' output become . . . (NCOB)", "Next N cells' output remain unchanged (NCRU)", and "Reset (RES)". When the decoder 106 receives the RES (reset) opcode, it copies its negative cell address 112 and 112' to the count register 110. Then, as each opcode is encountered the adder 108 adds the number of cells the instruction controls (N for NCOB and NCRU or 1 for COB) to the count register 110. When the count register overflows, the cell uses the opcode that caused the overflow to determine the new output value for the direct output means 104. For NCRU, the cell's direct output remains unchanged. For COB or NCOB, the cell adopts the data portion of the instruction for its new output data. The compression principle is similar to what current FAX machines use for data transmission except that the compression op-codes have been extended to cover changing displays as well as static displays. The datum that the cell can display can range, depending on the implementation, from one-bit black and white to multibit grayscales to true-color output. In a typical implementation the datum might be a 24-bit word where 8 bits each refer to the relative intensities of red, green and blue direct outputs 114, 114' and 114". A minimum-processing-power implementation can provide each cell with 8 direct outputs for each color with relative intensities of 1, 2, 4, 8, 16, 32, 64, and 128, corresponding to the intensity bits for that color. This uses the intensity bits directly as flags instead of processing them as a number. With the best lithography now used in production (December 1991), a density of over 100,000 cells per square inch is possible, giving such an array resolution several times better than and color reproduction far better than a glossy magazine photo. While a multi-million-cell array can be fit onto an 8-inch silicon wafer, such displays will be small, fragile, and expensive until continuous production techniques are used. These should increase size and reduce cost to comparable to today's CRT displays, but with a display quality several orders of magnitude better. With slightly more processing power per cell, an 8 bit intensity multiplier can be added to each datum to form a 32 bit word. The cell's processing can be the same except that the cell's entire set of direct outputs is switched on and off at a constant rate of at least 60 times per second, with the length of the "on" phase being proportional to the 8 bit intensity multiplier. This gives the display a far greater range of intensity and simplifies the adjustment of output brightness to compensate for changes in ambient light intensity. For continuous linear production, each cell can be fabricated using identical lithographic patterns, with the exception of the cell's address. Each cell contains an address region with 12 bits each for its X and Y array coordinates 112 and 112'. This makes address pattern 112 constant for every cell in a given column 12 (the direction of production), so these addresses can be formed with a constant pattern as part of the continuous production process. Because the other address pattern is constant for every cell in a given cell row 14 in a perpendicular direction, address pattern 112' is produced as a constant set of address lines which is then customized in a separate post-continuous-production finishing step using a constant pattern and motion perpendicular the original direction of production. Customization can be performed, for example, by using a linear array of lasers to selectively cut address lines in address regions 112'.

Figure 2A:
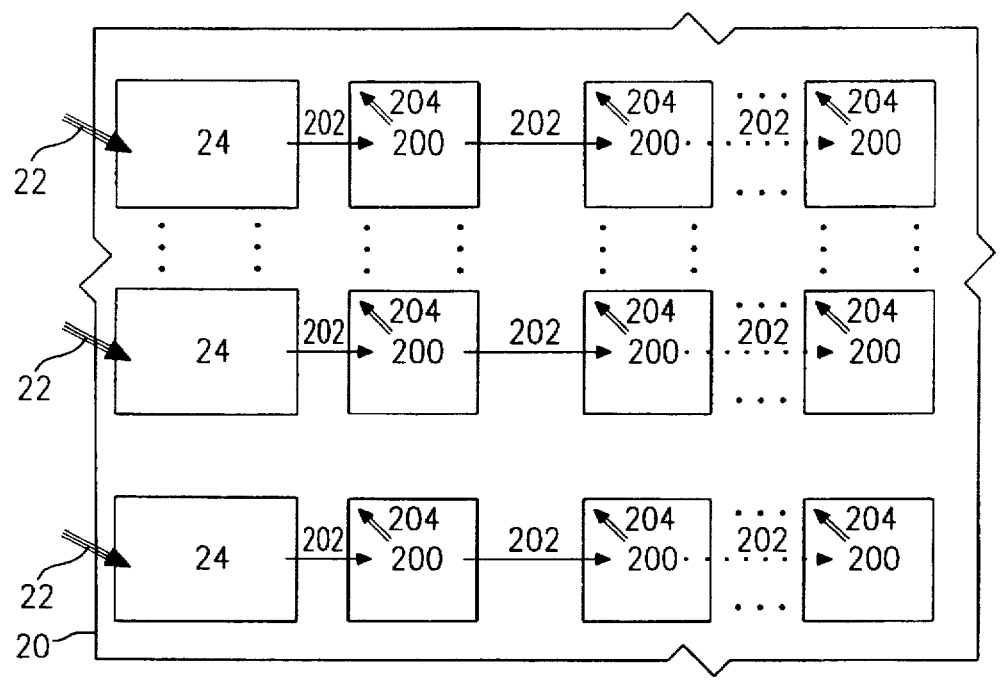
FIG. 2A is a functional depiction of an array of direct output data-decompression cells where the cells use neighbor-to-neighbor communication instead of cell addresses and a global input.
Figure 2B:
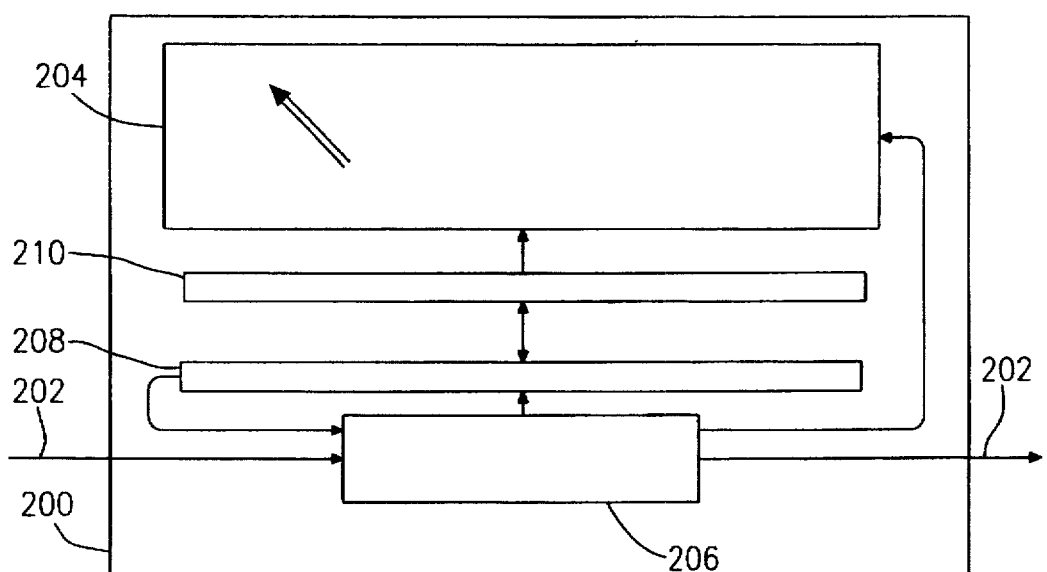
FIG. 2B is a functional depiction of one of the cells of FIG. 2A.

Even with data compression some output-intensive tasks will encounter a bottleneck in the global input to the cells, especially in extremely large arrays. The compressed-data-output architecture according to another embodiment of the present invention as shown in FIGS. 2A and 2B therefore replaces the global inputs 102 with means for communication with neighboring cells 202. The array 20 is composed of rows of direct output cells 200 where each cell can receive information from the cell "before" it, process the information received and send the processed information to the next cell. Adder 208 and count register 210 can be identical to adder 108 and count register 110 of the previous embodiment. Decoder 206 replaces decoder 106 for handling the decompression opcodes. As in the previous embodiment, there are many compression schemes that can be used. The scheme used in the previous example has been used here for consistency. While the compression opcodes are the same as those used in the previous embodiment, the processing is quite different. A reset (RES) opcode is always passed on to the next cell. After a reset opcode each cell 200 looks at the first opcode it receives. For COB and NCOB, it takes the immediately following data as its new value for direct output means 204. For COB it then removes the opcode and data from the stream, while for NCOB it decrements the cell control count N and only if N is zero does it remove the opcode and data from the stream. For NCRU, the cell's direct output means 204 remains unchanged, and the cell decrements the counter N and if N is zero it removes the opcode and data from the stream. The processing of the output datum that the cell receives can be identical to the previous embodiment, but this embodiment has several advantages. A separate input 22 is used for each row of cells, which removes the potential input bottleneck, and no addresses are needed by the cells, allowing all cells to be identical and eliminating post-continuous-production customizing. The disadvantage is that the connection to the data source becomes far more complex, consisting of many separate inputs 22, which can use either direct or external input means.

Massively Parallel Data Processing Architecture

Traditional computer architectures use separate devices for input, processing, memory and output. While this scheme is efficient when a single or small set of fast and expensive processors is performing compute-intensive operations on serial processing problems, limitations arise as the number of processors is increased to handle highly parallel problems. After the von Neumann single processor bottleneck is removed with multiple processors, memory access bottlenecks dominate next. Most massively parallel architectures solve this by having local memory associated with each processor. For compute-intensive problems this works well for implementations of up to tens of thousands of processors, such as the Connection Machine of Hillis, et al. Many parallel problems, however, (such as fluid-flow simulations), are output intensive as well as compute intensive, and as the number of processors increases the gathering and coordination of the output of the processors for transmission to an external device becomes a limiting factor. Increases in output resolution, such as the previously described compressed-output-data embodiments of the present invention, further increase the amount of output that must be gathered and coordinated.

Figure 3:
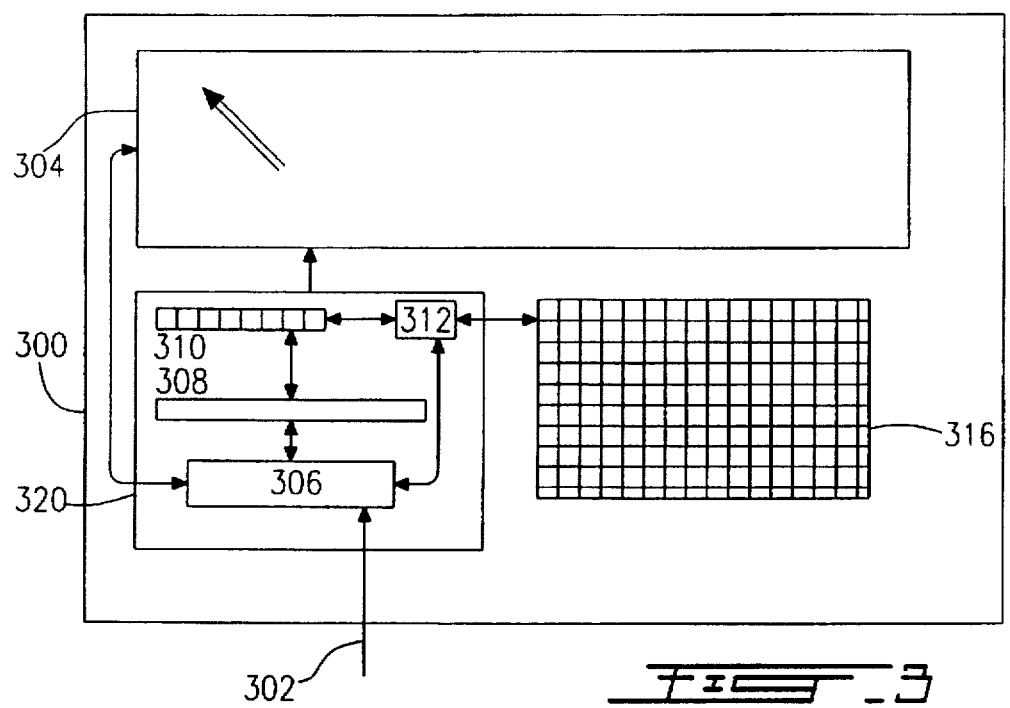
FIG. 3 is a functional depiction of one direct output processing cell of a massively parallel direct output data processing array in accordance with the invention.

Accordingly, the massively parallel data processing architecture aspect of the present invention as shown in FIG. 3 removes this bottleneck by providing an array of closely spaced cells 300 where each cell has direct output means 304 as well as means for memory 316, means for processing 320 and means for input 302. While processor 320 may be more complex than a RISC microprocessor, extremely simple processors are usually more suitable with the array architecture of the present invention. At a minimum each processor 320 should contain an instruction decoder 306, an arithmetic/logical unit 308, at least one register 310, and a memory fetch/store unit 312. By far the most useful sort of direct output means 304 is optical output means, although direct sonic and infra-red output will have uses as well. While it is possible to have the direct output means 304 placed between the cells and shared by neighboring cells (in a manner similar to the shared memories of U.S. Pat. Nos. 4,720,780 and 4,855,903), providing each cell 300 with its own direct output means 304 can produce better performance with simpler lithography. Providing each array cell 300 with its own direct output means 304 is the same as providing each output cell of previously described compressed-output-data architecture embodiments of the present invention with sufficient processing power for the array to process parallel problems as well to display the results. A processor/output array so designed avoids the complexity of having a multitude of connections between the processor array and external output devices, as well as allowing the array to be expanded indefinitely without an output bottleneck.

Figure 4A:
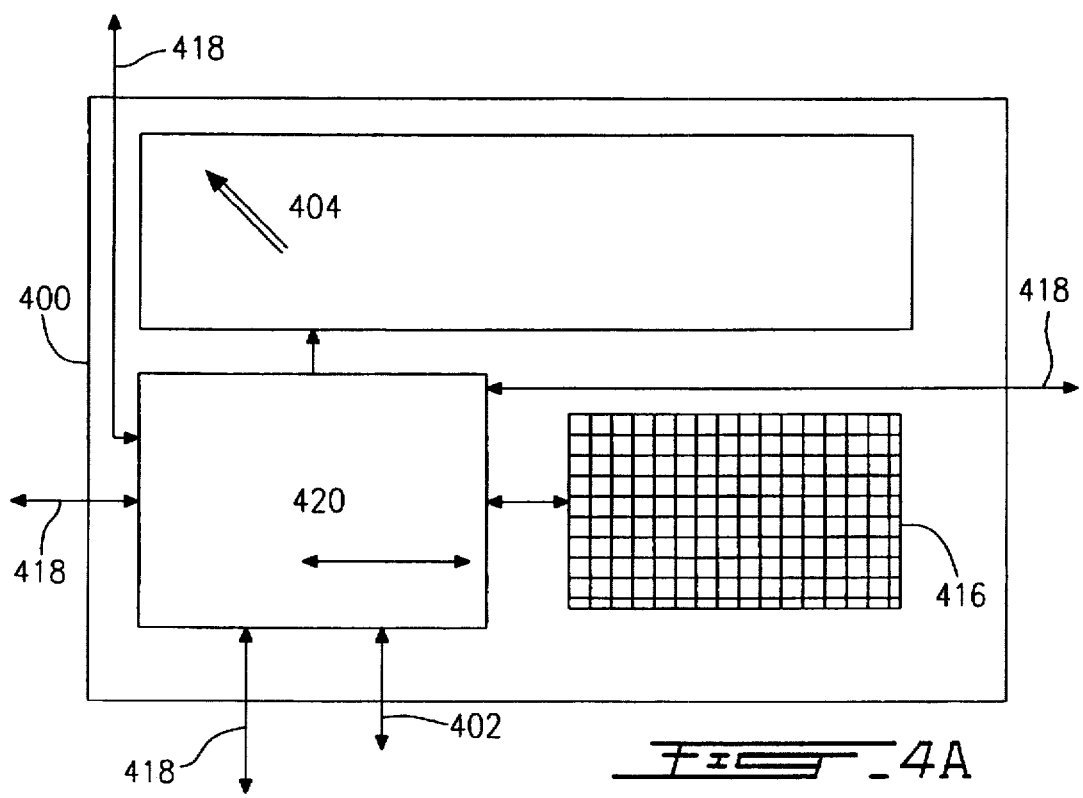
FIG. 4A is a functional depiction of one direct output processing cell where the cell has means for communication with neighboring cells and FIG. 4B is a functional depiction of an array of direct output processing cell with a functional depiction of the communication interconnections between neighboring cells.
Figure 4B:
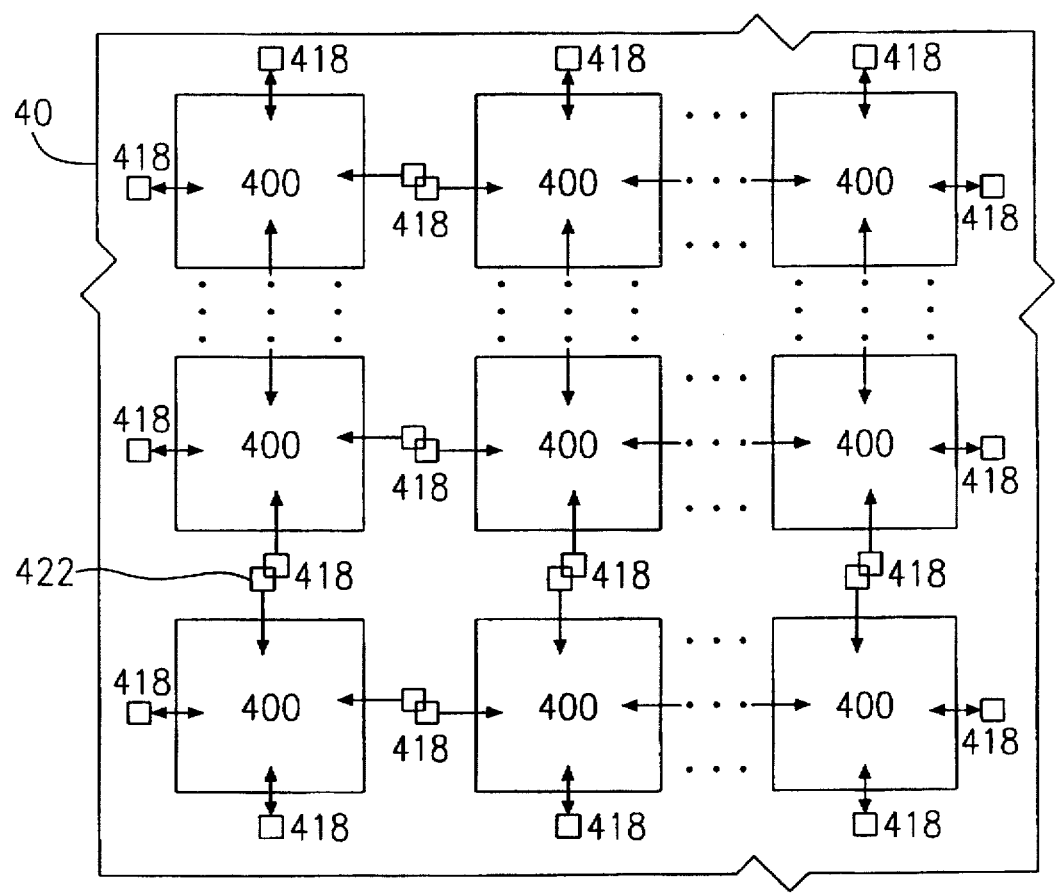

While an array of cellular processing elements which communicate solely through a global data bus is efficient at solving action-at-a-distance parallel computing problems such as galactic evolution, where every star exerts a gravitational pull on every other, most parallel processing problems, such as fluid dynamics, involve neighbor-to-neighbor interactions. A preferred embodiment of the massively parallel data processing architecture according to the present invention as shown in FIGS. 4A and 4B therefore provides an array 40 of closely spaced cells 400 where each cell has means 418 for communication with neighboring cells in addition to means 402 for input and output to a global data bus. This combination is simpler and is more efficient for most parallel processing problems than the hypercube connectivity used in the Connection Machines. Means 418 for communication between neighboring cells can be through direct connections or through memory means placed between the cells and shared by the cells in a manner similar to the shared memories of U.S. Pat. Nos. 4,720,780 and 4,855,903. One of the simplest systems that can use neighbor-to-neighbor connectivity is a neural network—each cell 400 needs only sufficient processing and memory to contain a connectivity value for each of its neighbors and to be able to add up these values when it receives signals from its neighbors, and, when the accumulation reaches a certain value, send signals to its neighbors and through the direct output means 404, for such an array 40 to perform useful work. While bi-directional communication 418 with two neighboring cells, one bit for a connectivity value for each of those cells, and a two bit register for adding connectivity values is theoretically sufficient to create a neural network in a sufficiently large array of cells, practical considerations dictate means 418 for bi-directional communication with at least three neighboring cells, memory for a connectivity value of at least 2 bits for each of those cells, and an accumulation register of at least 4 bits. Further additions of memory 416 and processing power 420 make neural networks far easier to implement and enable the interconnected array 40 to handle a wide range of other parallel processing tasks as well. Fluid dynamics simulations, for example, usually can be implemented with less than 64 bytes of memory 416 per cell 400, although more memory makes the job significantly easier. In rectilinear arrays of cells bi-directional connectivity 418 to four neighbors is expected to be optimal in almost all cases. For fabrication with current lithographic techniques, arrays 40 that are larger than the area of the fabrication masks use non-alignment-sensitive contacts 422 to connect neighboring cells across mask boundaries. This allows the use of rows or arrays of small individually aligned masks to produce large arrays as single units.

Figure 6A:
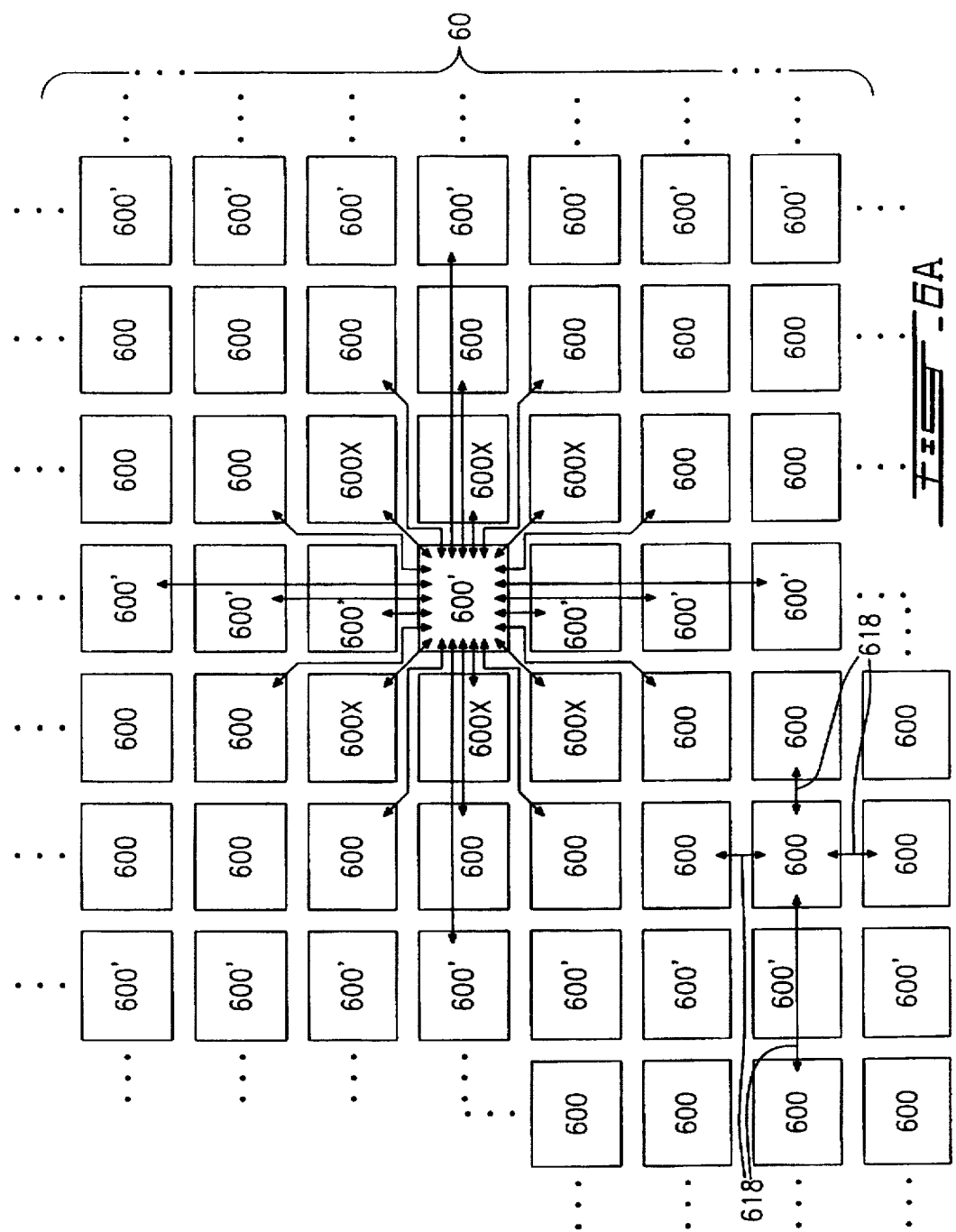
FIG. 6A is a geometric depiction of an array of processing cells with means for any of three spare cells to replace any defective cell.
Figure 6B:
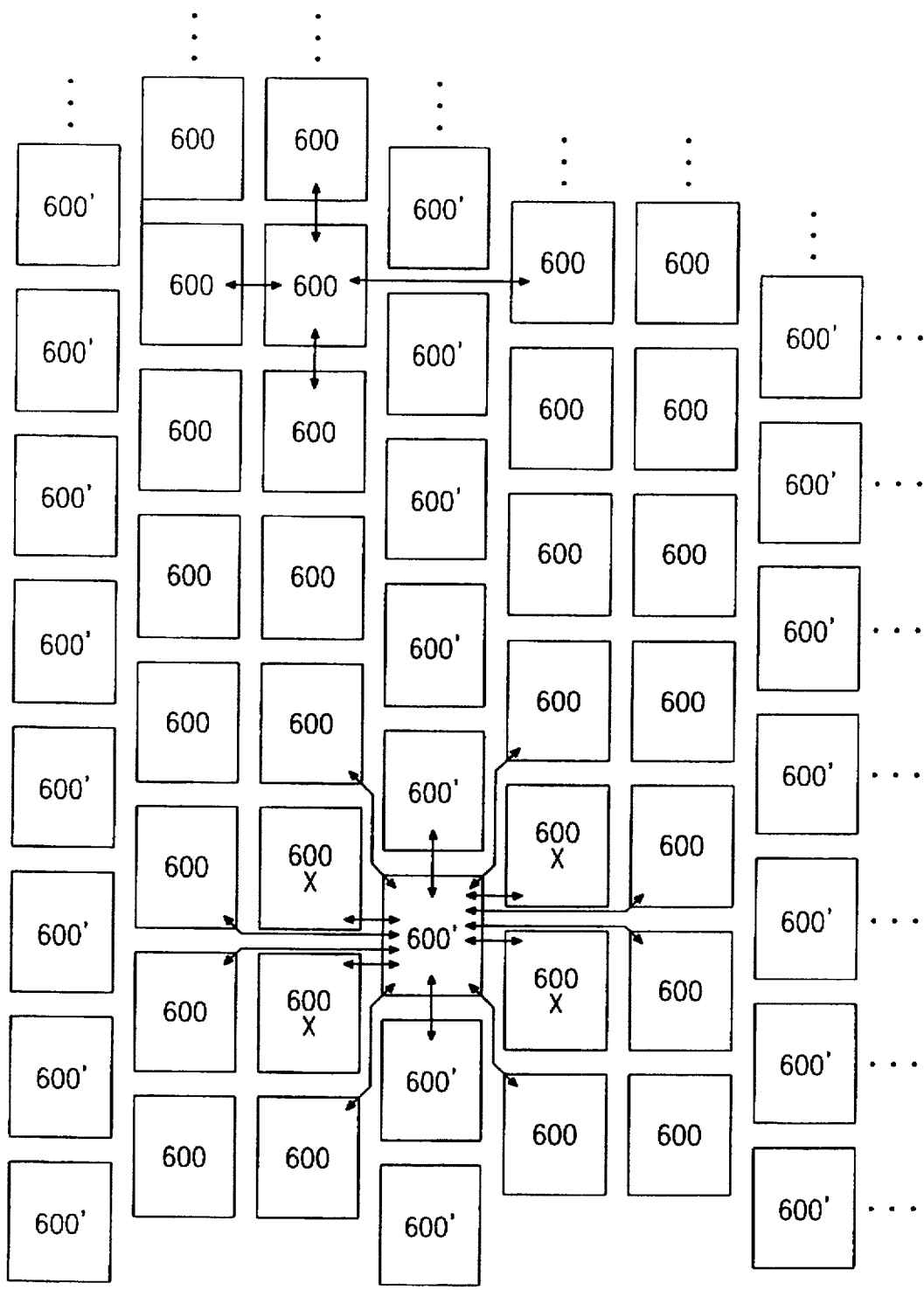
FIG. 6B is a geometric depiction of an array of processing cells with means for any of two spare cells to replace any defective cell.
Figure 6C:
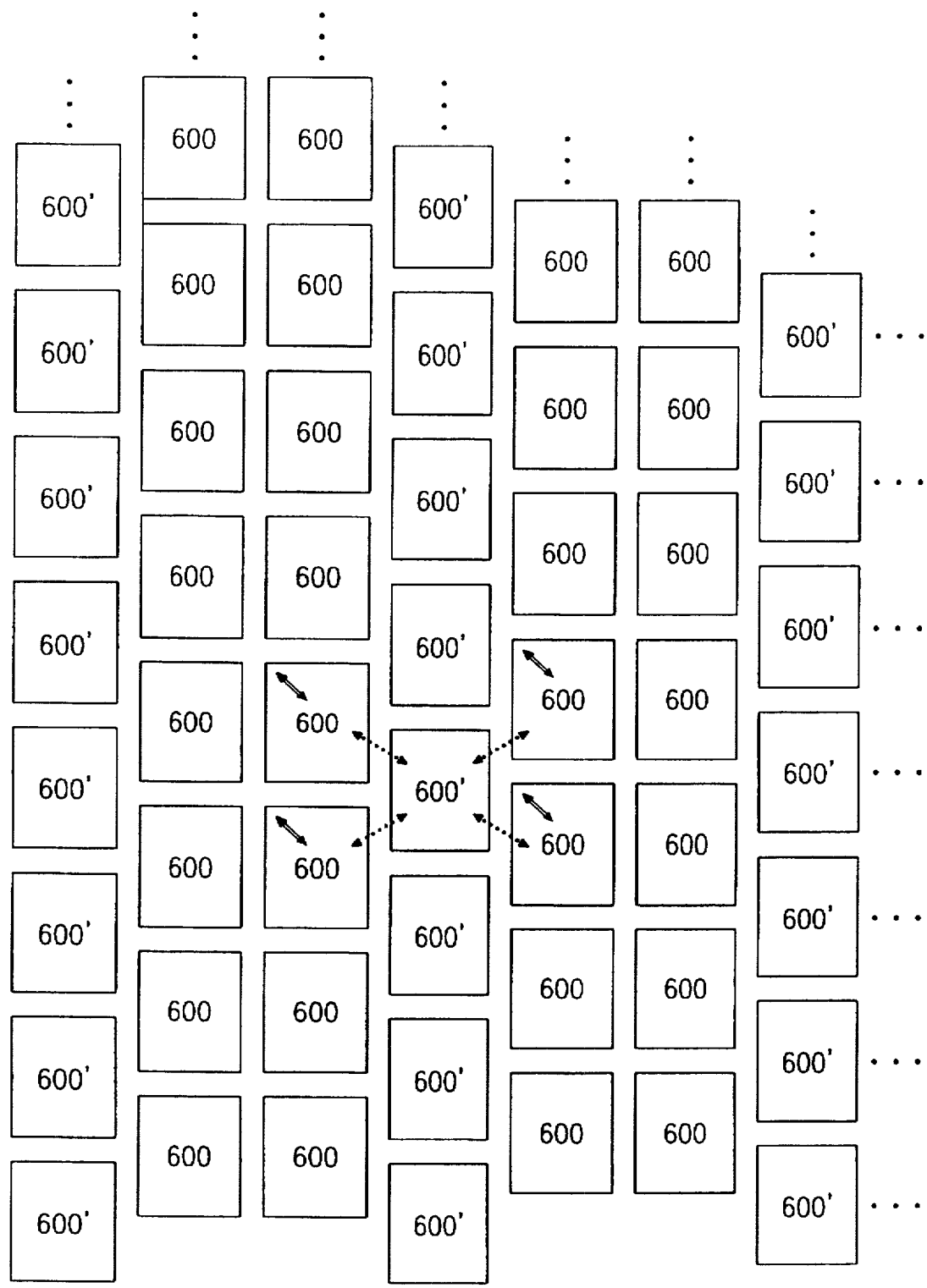
FIG. 6C is a geometric depiction of an array of processing cells with means for spare cells to control the direct inputs and outputs of cells that they replace.

In a further preferred embodiment of the massively parallel data processing architecture according to the present invention as shown in FIGS. 6A, 6B and 6C, the array 60 of closely spaced cells 600 contains spare cells 600' interconnected to the active cells 600 in a manner such that should any active cell prove defective, at least one spare cell can replace its functions. While this can be done by pairing a spare cell with each active cell, a far more effective way is to provide a column of spare cells 600' for every two columns of active cells 600, and to interconnect the cells so that more than one spare cell can take over the functions of any given active cell. This provides an extremely error-tolerant system, which is of critical importance in allowing a large array of cells to be fabricated as a single unit. When pushing the limits of lithography it is not uncommon to average a 200 errors per 5" wafer. Under such conditions an implementation that allows any of three spare cells to take over for any defective cell will increase yields of a full-wafer system with 1000 cells per square inch from near zero to over 99.99%. With a continuous linear production line producing page-sized (8 ½"×11") systems, error-tolerance will be even more critical. It may be advantageous for spare cells not to have their own direct output means, but to use the direct output means of the defective cells they replace instead, as shown in FIG. 6C. With optical output means that reflect or refract ambient light this allows the direct outputs from the active cells to cover substantially all of the surface of the array, increasing the percentage of ambient light that can be controlled, and for all direct output means it keeps the direct output lined up with the cell that would normally have produced it. While this does not provide the same degree of error tolerance for direct output as for processing and memory, the control means for the cell's direct output means contains relatively little function compared to the cells memory and processing means, so errors in it should be relatively rare. Means for the output control can also thus be made robust or have redundancy built in at little cost in cell area. Furthermore, a defective output pixel would not be as serious for most array uses as a defective processor or memory. In arrays where the active cells do not have means for communication with neighboring cells, no other connections between spare cells and active cells are needed. In arrays where active cells have neighbor-to-neighbor connections, however, the spare cells must be able to replace these connections as well, as shown in FIGS. 6A and 6B. The lower left corner of FIG. 6A shows the interconnections between one active cell 600 and its nearest neighbor active cells in each direction. While only one active cell's connections have been shown, in an actual such array all active cells would be so connected to their neighboring active cells. The center of FIG. 6A shows the connections between one spare cell 600' in this array and all of the cells it has connections to. This spare cell can take over for any of its neighboring active cells 600, which have been marked with an 'X' for clarity. Because any active cell can be taken over for by the adjacent spare cell in its own row or the row above or below it, there are three spare cells that can take over for any active cell. FIG. 6B shows a similar scheme where either of two spare cells can take over for any defective active cell. The spare cell scheme as shown in FIGS. 6A and 6B can be extended to provide still more spare cells capable of replacing any given active cell either by providing the ability for each spare cell to replace more of its neighboring active cells, or, should inter-cell connectivity space be at a premium, by alternating a column of spare cells for every one column of active cells.

In a further preferred embodiment of the massively parallel data processing architecture according to the present invention as shown in FIG. 8, each array cell 800 has both direct input means 824 and direct output means 804 as well as means for memory 816 and processing 818. Access 802 to a global data bus and means 818 for communication with neighboring cells are usually useful additions to this embodiment as well. Useful types of direct input means 824 include but are not limited to optical, sonic, infra-red, and touch/proximity. Having the cells equipped with both direct input means and direct output means allows the array to handle input intensive tasks without encountering an input bottleneck gives the cells the ability to interact with the outside world in a variety of ways. With optical direct output means and touch/proximity direct input means, for example, a portion of the array can "display" itself as a keyboard for any language, ad data can be entered by typing on the "keys". Then, hen more area is required for the output, that section of the array can "become" part of the output display. Having both optical direct input means and optical direct output means as shown in FIG. 9 is also especially preferred—input and output between the array 90 and separate devices 926, such as mass storage systems or network interfaces, can then be done through device that are placed in proximity to the array and communicate through the cells' direct inputs and outputs. This allows the array to use external input and output devices without physical connections to those external devices, reducing total system complexity, fragility and costs. Since each cell 900 has direct optical input and output means, this also allows arrays to communicate extremely rapidly with each other when placed face to face. In the case where the direct optical output means are light emitting means, this also allows the array to scan documents by emitting light through these outputs and receiving the reflected light through its direct optical inputs.

The commercial viability and ease of acceptance of a new data processing architecture are greatly enhanced if it is compatible with existing software. With the massively parallel data processing architecture disclosed in the present invention compatibility can be achieved without each cell being able to handle the hundreds of instructions of a CISC microprocessor architecture or even the dozens of instructions of a RISC microprocessor architecture. If a given cell has sufficient memory and processing power to handle one instruction from the target instruction set, then a set of dozens or hundreds of cells can cooperate to emulate the entire instruction set. A further preferred embodiment of the massively parallel data processing architecture of the present invention therefore includes sufficient processing power for each cell to handle any one instruction from a current RISC or CISC microprocessor architecture, allowing sections of the array to be programmed to run existing software in addition to software in the array's native instruction set. Further memory is, of course, highly advantageous, with between 1024 and 4096 bytes per cell providing a good balance between cell size and cell memory for arrays designed to emulate other processors. In such embodiments it is advantageous to have a regional data bus connecting the set of cells that are used to emulate the more complex processor. A regional data bus gives each emulated processor access to the combined memories of its component cells without the overhead of multiple neighbor-to-neighbor passes and without creating a bottleneck on the global data bus. In especially preferred embodiments the size of the regional data bus is not predefined—cells have the ability to join or leave a regional data bus, allowing its size to change as processing tasks change.

In a further preferred embodiment of the massively parallel data processing architecture of the present invention as shown in FIG. 5, each array cell 1000 is equipped with input and output means 1002 to a global data bus, means 1018 for input and output communication with each of its neighboring cells in two dimensions, sufficient memory 1016 and processing power 1020 to decompress a data stream and to emulate at least any one instruction from a RISC or CISC microprocessor instruction set, true-color 1004 and sonic 1032 direct output means and true-color 1024, capacitance touch/proximity 1030 and sonic 1034 direct input means, and means 1036 to join a regional data bus. This allows the array, in conjunction with network interface devices and appropriate storage devices (which need not be physically connected to the array), to function as a super high resolution TV, a super high fidelity sound system, a standard sonic and true-color picture telephone, a document scanner/facsimile machine, and a voice, vision and touch activated super computer that is upward compatible with existing software.

Figure 7:
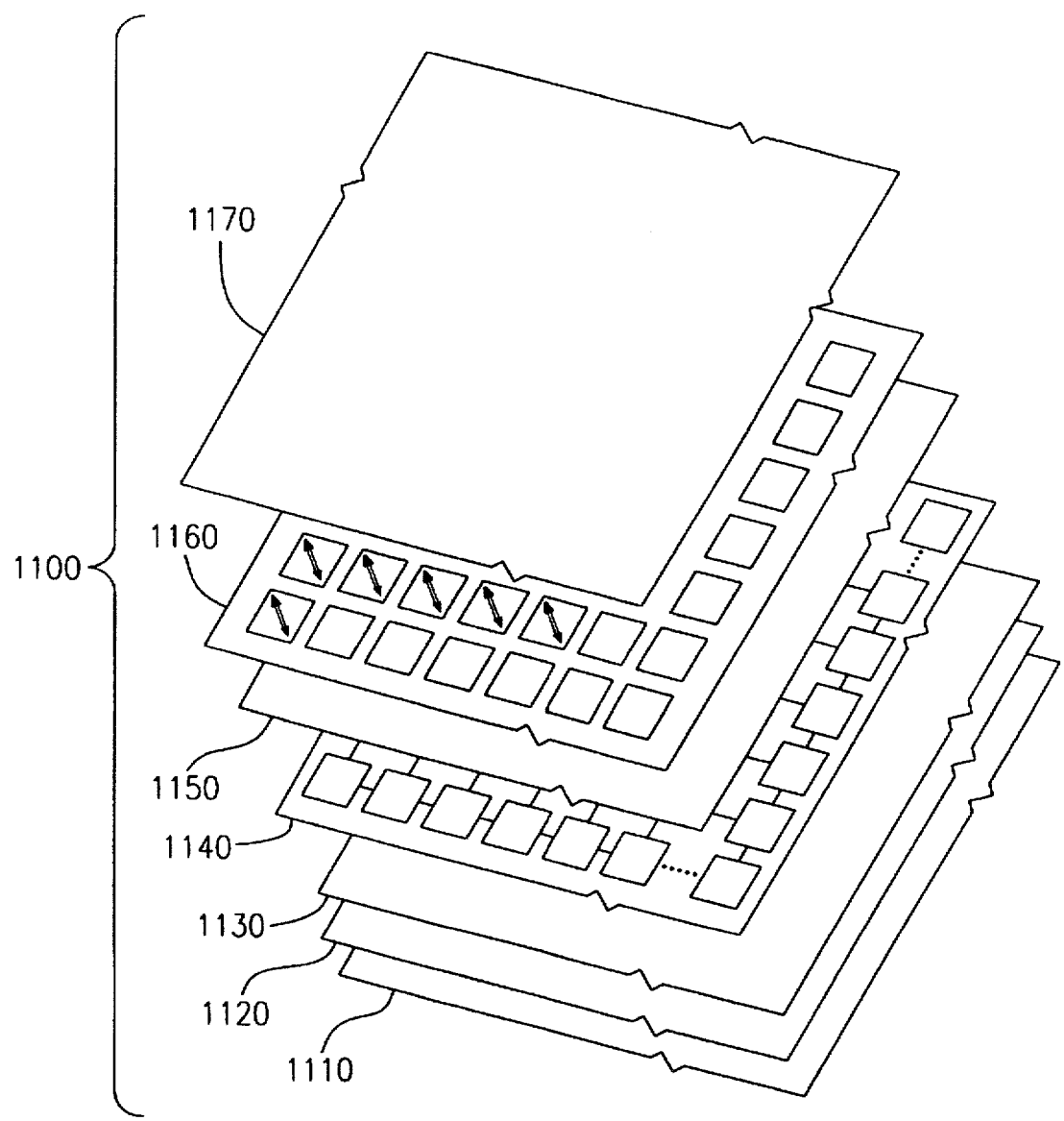
FIG. 7 is a geometric depiction of an array of direct I/O processing cells fabricated as a thin sheet composed of series of thin layers.

In exceptionally preferred embodiments of the present invention, the entire array of closely spaced cells of any of the embodiments described above is fabricated as a single thin flexible sheet. This can be done, for example, by fabricating the array from thin layers of amorphous silicon and metallic conductors on a thin plastic substrate. In the example shown in FIG. 7, the array 1100 is fabricated as follows: Layer 1110 is smooth sheet of fairly stiff plastic (LEXAN, for example) around 250 microns (10 mils) thick. For arrays where cells have access to a global data bus, the global data bus layer 1120 is created next by vacuum depositing a 25 micron layer of aluminum, followed by a layer of sputtered quartz or some similar insulator. Power layer 1130 is created in a similar fashion. For arrays with a global data bus, a small hole for each cell is etched through the power layer to the global data bus, and an insulated vertical "wire" is deposited inside to give the cell access to the global data bus. Next the processor/memory layer 1140 is built. A layer of amorphous silicon (or other semiconductor material) around 50 microns thick is deposited and doped through a low-temperature doping system (such as ion implant) in a manner similar to standard integrated circuit fabrication. Metalized layers are used to connect the elements in the processor/memory layer standard integrated circuit chip manner (except for connections to power and ground). Next a layer of insulator is deposited everywhere except where connections to the ground layer will go. The ground layer 1150 is created in the same manner as the power layer 1130. For arrays which require external power connections, the power and ground layers have regions left exposed at the sides of the array, to which the appropriate connections are made. Holes are drilled through to contacts in the processor/memory layer and insulated vertical "wires" are deposited inside these holes to give the processor/memory layer 1140 access to the direct I/O layer 1160. The direct I/O layer 1160 is added next, with the direct optical outputs fabricated in a manner similar to any of those used in making pixels on a flat-panel portable computer display, the direct optical inputs fabricated in a manner similar to that used in making a CCD input chip, and the touch/proximity direct inputs fabricated as miniature standard capacitance touch/proximity detectors. All of these techniques are well known in the art. The top layer 1170 is a clear protective layer—100 microns of LEXAN (polycarbonate) provides scratch resistance and brings the total thickness up to around 650 microns, or 0.65 mm. Thus the entire array of cells in this implementation is a stiff but not brittle sheet under a millimeter thick. Because systems built this way are extremely portable, it is advantageous to design all of the elements for minimal power consumption (i.e. SRAMS instead of DRAMS). While different orderings of the layers can be used, the ordering chosen for this example has some important advantages. The processor/memory layer is sandwiched directly between the power and ground layers for fast and easy access to power, which speeds up processing and reduces power requirements. Also, the ground layer and the global data bus layer shield the sensitive processor/memory layer from external electromagnetic interference. If the array is equipped with sufficient photovoltaic receptor area, a carefully designed array can be powered entirely by ambient light, eliminating the need for external power supplies. If each cell has its own photovoltaic receptor, it should even be possible to get rid of the power and ground layers, simplifying production considerably.

All examples used in this patent are to be taken as illustrative and not as limiting. As will be apparent to those skilled in the art, numerous modifications to the examples given above may be made within the scope and spirit of the invention. While flat rectilinear arrays have been shown for simplicity, cells can be connected in triangular, hexagonal, octagonal or other configurations. Such configurations need not be planar—the surface of a sphere, for example, can be covered with interconnected cells. It is also possible to use layers of cells with direct connections to input and output elements on the surface, or to use three dimensional arrays of cells where only the surface cells have direct output capabilities. One way to achieve this effect with planar arrays is to have direct inputs and outputs on both faces of the array so that separate arrays can be stacked into a 3-D array processor of incredible speed. It is also possible to add layers to an array that speed up long-distance cell-to-cell communication, such as by implementing the hypercube connectivity used in the Connection Machine. While such additions are not expected to be cost-effective for most uses of the systems disclosed in this patent, they may prove advantageous for special applications.

Array elements in the present invention are not limited to silicon, to semi-conductors in general, or even to electronics. An optical processor and memory array could be very conveniently coupled to direct optical inputs and outputs, for example. Nor are the cells' elements limited to binary or even digital systems. A hybrid system where each cell had analog input and analog connections to neighbors in addition to digital processing, memory, and direct output appears to be very promising for real-time vision recognition systems. It is also possible to have more than one processor per cell.

Nor are the sizes of the features used in the examples to be taken as maxima or minima. Using current lithography the architecture disclosed can pack the power of a Cray YMP supercomputer into an array the size of a credit card, and even smaller arrays will prove useful, too. The architecture will also support multi-billion-cell arrays the size of a movie theater screen with equal ease.

I claim:

1. A massively parallel data processing system comprising an array of closely spaced cells, each said cell having input means, processing means, memory means and direct output means, said direct output means for each of said cells is dedicated solely to its associated said array cell, wherein said memory means and said processing means are sufficient to extract a datum from a compressed data stream prior to transmitting that datum through the direct output means, each cell further including a carrier through which controlling signals for said direct output means are sent to said direct output means, each said carrier dedicated solely to its associated said array cell, and wherein said direct output means transmits said output signal directly external to said array of cells into a transmissive medium covering a plurality of said cells, wherein said direct output means comprises optical direct output means, said optical direct output means from said array of cells collectively form a human-readable display.

2. A massively parallel data processing system as claimed in claim 1, wherein each said cell further comprises means for communication with neighboring said cells.

3. A massively parallel data processing system as claimed in claim 2, wherein: each said cell further comprises means for bi-directionally communicating with at least three neighboring said cells, said memory means comprises means for storing a value of at least two bits for each of said neighboring cells and for storing a sum of at least four bits, and said processing means comprises means for adding the corresponding value to the sum when said cell receives a signal from one of said neighboring cells and sending a signal to said neighboring cells and through said direct output means of said cell when the sum exceeds a given value.

4. A massively parallel data processing system as claimed in claim 2, wherein said cells are organized into columns and all said cells in each corresponding column have identical logical characteristics and are produced with substantially identical lithographic patterns.

5. A massively parallel data processing system as claimed in claim 3, wherein:

said direct output means for each said cell comprises multiple direct outputs; and each said cell includes means for simulating an array of simpler cells, each said simpler call having associated input means, processing means, memory means and direct output means.

6. A massively parallel data processing system as claimed in claim 3, wherein each said cell further comprises input means from and output means to a global data bus.

7. A massively parallel data processing system as claimed in claim 3, wherein each said cell further comprises means for emulating any one instruction from at least one pre-existing RISC or CISC instruction set other than its own instruction set, and means for a plurality of said cells to cooperate in emulating the entire said RISC or CISC instruction set.

8. A massively parallel data processing system as claimed in claim 7, wherein each said cell further comprises means for joining and leaving a regional data bus.

9. A massively parallel data processing system as claimed in claim 3, wherein said direct output means comprises an optical direct output means and each said cell further comprises touch or proximity direct input means, said direct input means comprises means for receiving an input signal from outside said array of cells, with said input signal passing directly into said cell from said transmissive medium, said direct input means being independent of and unshared with other said cells.

10. A massively parallel data processing system as claimed in claim 9, wherein said direct output means comprises sonic direct output means and said direct input means comprises sonic direct input means.

11. A massively parallel data processing system as claimed in claim 1, wherein said array of cells is fabricated as a sheet having a total thickness of less than 1 millimeter.

12. A massively parallel data processing system as claimed in claim 2, wherein said array of cells is fabricated a sheet having a total thickness of less than 1 millimeter.

13. A massively parallel data processing system as claimed in claim 3, wherein said array of cells is fabricated as a sheet having a total thickness of less than 1 millimeter.

14. A massively parallel data processing system as claimed in claim 4, wherein said array of cells is fabricated as a sheet having a total thickness of less than 1 millimeter.

15. A massively parallel data processing system as claimed in claim 5, wherein said array of cells is fabricated as a sheet having a total thickness of less than 1 millimeter.

16. A massively parallel data processing system as claimed in claim 6, wherein said array of cells is fabricated as a sheet whose total thickness is less than 1 millimeter.

17. A massively parallel data processing system as claimed in claim 7, wherein said array of cells is fabricated as a sheet having a total thickness of less than 1 millimeter.

18. A massively parallel data processing system as claimed in claim 8, wherein said array of cells is fabricated as a sheet having a total thickness of less than 1 millimeter.

19. A massively parallel data processing system as claimed in claim 9, wherein said array of cells is fabricated as a sheet having a total thickness of less than 1 millimeter.

* * * * *